United States Patent [19]

Tahara et al.

[11] Patent Number: 4,603,263
[45] Date of Patent: Jul. 29, 1986

[54] JOSEPHSON PULSE GENERATOR OF CURRENT INJECTION TYPE

[75] Inventors: Shuichi Tahara; Jun'ichi Sone, both of Tokyo, Japan

[73] Assignee: Nippon Electric Co., Ltd., Tokyo, Japan

[21] Appl. No.: 468,908

[22] Filed: Feb. 23, 1983

[30] Foreign Application Priority Data

Feb. 26, 1982 [JP] Japan .................................. 57-30316
Feb. 26, 1982 [JP] Japan .................................. 57-30317

[51] Int. Cl.$^4$ ............................................. H03K 3/38
[52] U.S. Cl. .................................... 307/277; 307/263; 307/306
[58] Field of Search ............... 307/277, 263, 268, 306; 357/5

[56] References Cited

U.S. PATENT DOCUMENTS 4,313,066  1/1982  Gheewala ........................... 307/277

OTHER PUBLICATIONS

D. B. Tuckerman, "A Josephson Ultrahigh-Resolution Sampling System", Appl. Phys. Lett., vol. 36, No. 12, 15 Jun. 1980, pp. 1008–1010.

Primary Examiner—John Zazworsky
Attorney, Agent, or Firm—Sughrue, Mion, Zinn, Macpeak, and Seas

[57] ABSTRACT

A Josephson pulse generator of the current injection type is composed of a first group of N (N≧2) resistors, one end of each being connected together, the other ends of two of the N resistors being connected to first and second nodes. A second group of serially connected N−1 resistors is connected between the first and second nodes and to the other ends of the N−2 resistors in the first group not connected to the first and second nodes. N Josephson junctions are each connected between a reference potential and the other end of a different one of the N resistors. Two additional Josephson junctions, each having one end thereof connected, respectively, to the first node and the second node is provided along with an additional resistor connected between the other end of the Josephson junction connected to the first node and the reference potential.

6 Claims, 6 Drawing Figures

JOSEPHSON PULSE GENERATOR OF CURRENT INJECTION TYPE

BACKGROUND OF THE INVENTION

The present invention relates to a pulse generator of the current injection type using the Josephson junctions, and more particularly to improvements thereof for generating pulses of very short width without causing resonance and for enabling high density integration.

To realize a high-speed computer with low power consumption using the Josephson junction integrated circuit, not only must the memory circuit, logic circuit and control circuit making up the computer operate with a short access time or cycle time but also the pulse rise time and pulse fall time as well as the pulse width must be short.

In order to satisfy this requirement a pulse generator using the Josephson junctiors has been proposed in a publication "A Josephson ultrahigh-resolution sampling system", David B. Tuckerman, Appl. Phys. Lett. 36(12), 15 June 1980, pp 1008 to 1010. This circuit is composed of a combination of an interferometer logic gate circuit and a single Josephson junction. In this pulse generator, in response to an input current the gate circuit being supplied with a gate current is switched into the voltage state to inject the gate current into the single Josephson junction, thereby producing the injected current as an output current. When the injected current exceeds the critical current of the Josephson junction, the Josephson junction is switched into the voltage state so that the output current is cut off. As a result, there is obtained the output pulse current whose rise time is given by the switching time of the interferometer logic gate circuit and fall time is given by the switching time of the single Josephson junction.

However, a large chip area is required to form the inductance component necessary to magnetically couple the input current in the interferometer logic gate circuit, and the accurate control of the inductance value is difficult. A closed loop including the above inductance and the capacity of the Josephson junction in the gate circuit causes a resonance which should be damped. Further, such a gate tends to trap stray magnetic flux when switched to the superconducting state, resulting in malfunctions.

SUMMARY OF THE INVENTION

An object of this invention is to provide a Josephson pulse generator of the current injection type which removes the inductance component and suppress the resonance phenomenon.

Another object of this invention is to provide a Josephson pulse generator of the current injection type which is capable of generating pulses of very short pulse width.

Still another object of this invention is to provide a Josephson pulse generator of the current injection type which has an improved operating margin and gain.

A further object of this invention is to provide a Josephson pulse generator of the current injection type which is easy to fabricate and suitable for high density integration.

According to one aspect of the present invention there is provided a circuit utilizing Josephson junctions comprising a first group of "N" ($N \geq 2$) resistors connected together at one end thereof and each having a predetermined resistance, a second group of "N−1" resistors each being connected between the other ends of two of the "N" resistors and having a predetermined resistance, the second group of resistors being connected in series between a first node and a second node, a first group of "N" Josephson junctions connected between a reference potential and one of the other ends of the first group resistors and each having a predetermined critical current, a first Josephson junction connected at one end thereof with the first node and having a predetermined critical current, and a first resistor connected between the reference potential and the other end of the first Josephson junction and having a predetermined resistance, and a second Josephson junction connected at one end thereeof with the second node and having a predetermined critical current, the circuit producing an ultra-short duration pulse from the other end of the second Josephson junction when two currents of predetermined amplitude are supplied to the node between the first Josephson junction and the first resistor and to the one end of the first group of resistors. According to another aspect of the invention a shorter duration pulse can be produced by connecting an inductance component in series with the first resistor of the foregoing circuit.

Other objects and features of the present invention will beocme apparent from the following description when read with reference to the accompanying drawings.

DETAILED DESCRIPTION OF THE PREFERRED EMBODIMENTS

Figure 1:
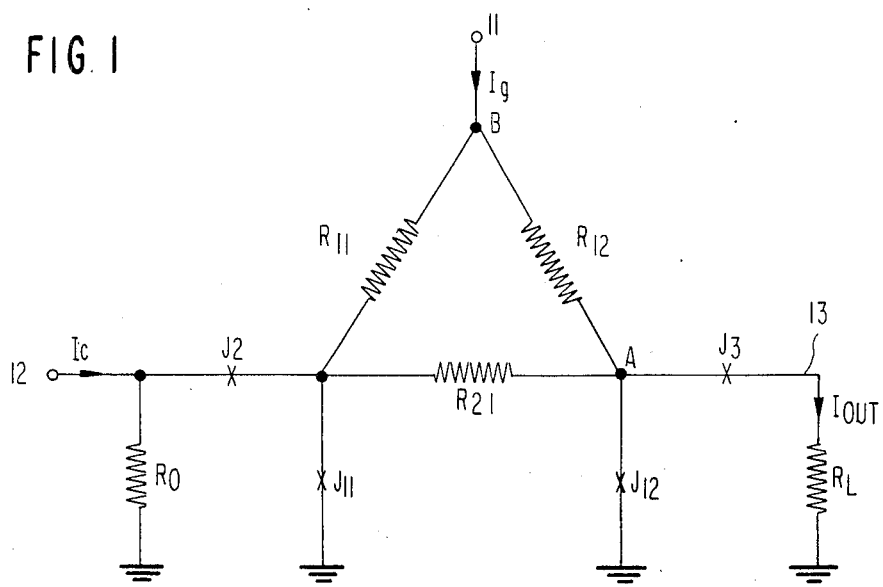
FIG. 1 is a circuit of a pulse generator representing one embodiment of the present invention.

FIG. 1 shows a pulse generator of the current injection type according to a first embodiment of this invention. In this figure, reference symbols $J_{11}$, $J_{12}$, $J_2$ and $J_3$ denote Josephson junctions having critical currents $I_{11}$, $I_{12}$, $I_2$ and $I_3$ respectively; $R_{11}$, $R_{12}$, $R_{21}$, $R_0$ resistors having resistances $r_{11}$, $r_{12}$, $r_{21}$ and $r_0$ respectively; 11 a gate current supply terminal; 12 an input terminal; 13 an output line; and $R_L$ a load resistor with a resistance $r_L$. With the pulse generator of this embodiment, an input/output separation function is added to the pulse generation function and an improvement is made on the gain.

The gate current $I_g$ supplied from the gate current supply terminal 11 is divided into two paths, a first path consisting of the resistor $R_{11}$ and the Josephson junction $J_{11}$ and a second path consisting of the resistor $R_{12}$ and the Josephson junction $J_{12}$. With currents $I_{g1}$ and $I_{g2}$ flowing through the first path and second path, respectively ($I_{g1} + I_{g2} = I_g$), the input current Ic injected from the input terminal 12 flows through the Josephson junctions $J_2$ and $J_{11}$ into ground. Consequently, both the gate current $I_{g1}$ and the input current Ic are injected into the Josephson junction $J_{11}$, to switch the junction $J_{11}$ into the voltage state. The current flowing through the Josephson junction $J_{11}$ is then injected into the Josephson junction $J_{12}$ through the resistor $R_{21}$ and the resistors $R_{11}$, $R_{12}$ thereby switching the Josephson junction $J_{12}$ into the voltage state. Accordingly, the gate current $I_g$ is distributed into two paths, a first path consisting of the Josephson junction $J_2$ and the resistor $R_0$ and a second path consisting of the Josephson junction $J_3$, an output line 13 and the load resistor $R_L$. If $r_L$ is set greater than $r_0$, almost all the gate current $I_g$ flows into the first path, switching the Josephson junction $J_2$ into the voltage state. As a result, the input current $I_c$ flows through the resistor $R_0$ into ground while the gate current $I_g$ flows through the Josephson $J_3$, the output line 13 and into the load resistor $R_L$, thereby achieving the separation between the input and output.

When the current flowing through the output line 13 exceeds the critical current value $I_3$ of the Josephson junction $J_3$, the Josephson junction $J_3$ is switched into the voltage state, interrupting the output current. Therefore, a pulse current is obtained through the output line 13. The gate current $I_g$ is distributed according to the resistance values of the four Josephson junctions in the voltage state and flows into ground.

Figure 2:
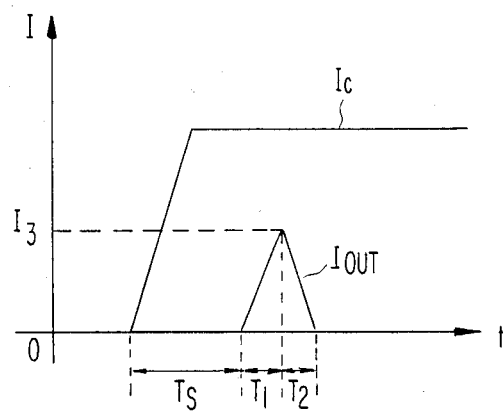
FIG. 2 is a diagram showing an output pulse waveform from the circuit of FIG. 1.

FIG. 2 shows a waveform of the output pulse current $I_{out}$ obtained in a manner described above. The pulse current $I_{out}$ starts to rise after the elapse of the turn-on delay time $T_s$ necessary for the gate circuit in FIG. 1 to switch into the voltage state and continues to rise for the duration of a rise time $T_1$ of the gate circuit to the left of the Josephson junction $J_3$. Then the pulse $I_{out}$ goes down for the duration of a rise time $T_2$ of the Josephson junction $J_3$. Therefore, the pulse width is determined as $(T_1+T_2)$. In consideration that the obtainable switching time of the Josephson junction is about 10 picoseconds, the pulse width of 20 picoseconds may be obtained by the above circuit.

The above pulse generator, if applied with appropriate design rule, will be able to operate correctly over a wide operating range. For this purpose, the following design rule is proposed.

Figure 3:
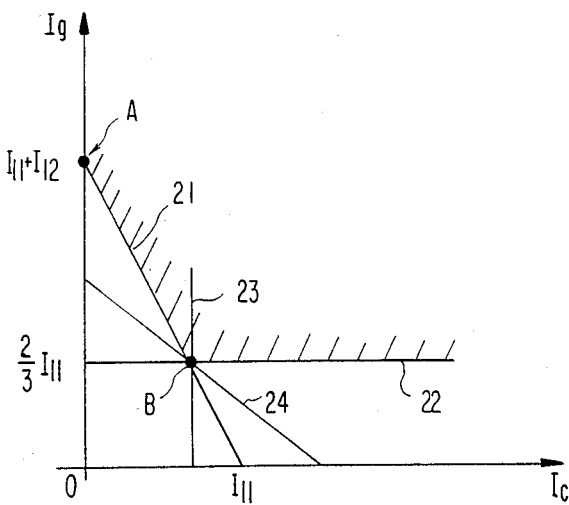
FIG. 3 is a control characteristic diagram for the gate circuit of the pulse generator of FIG. 1.

$r_{11} = r_{12} = r_{21} = \frac{3}{4} r_0 = \frac{1}{8} r_L$ $I_{11} = I_{12} = 3/2\ I_2 = I_3$ This design rule is based on the control characteristic of the above pulse generator as shown in FIG. 3 which shows the control characteristic of the gate circuit (circuit on the left side of the Josephson junction $J_3$ of FIG. 1) in the pulse generator with the shaded portion representing the voltage state of the gate circuit. The line 21 represents the threshold value characteristic for switching the Josephson junction $J_{11}$ into the voltage state; the line 23 for switching the Josephson junction $J_2$ into the voltage state with the Josephson Junction $J_{11}$ in the zero-voltage state; the line 24 for switching the Josephson junction $J_{12}$ after the completion of switching of the Josephson junction $J_{11}$; the line 22 for switching the Josephson junction $J_2$ after the completion of switching of the Josephson junctions $J_{11}$, $J_{12}$. Referring to FIG. 3, in order to obtain a wide operating margin, it is appropriate to set the following conditions $I_{11} = I_{12} = 3/2\ I_2$ for making the lines 21, 22, 23 intersect each other at a point; and $r_{11} = r_{12} = r_{21} = \frac{3}{4} r_0$ for placing the line 24 inside the shaded portion determined by the lines 21 and 22. Further, in order to prevent the input current $I_c$ from backlashing and make the input current $I_c$ flow through the resistor $R_0$ into ground even when the Josephson junction $J_2$ is switched into the voltage state, the condition $r_0 < < r_L$ must be satisfied. $\frac{3}{4} r_0 = \frac{1}{8} r_L$ is chosen for example.

The above-mentioned design criteria will be explained in the following. The currents $i_{11}$ ($=I_{g1}$) and $i_{12}$ ($=I_{g2}$) flowing through the resistors $R_{11}$ and $R_{12}$ into the Josephson junctions $J_{11}$ and $J_{12}$ are given by $$i_{11} = \frac{r_{12}}{r_{11} + r_{12}} I_g \tag{1}$$

$$i_{12} = \frac{r_{11}}{r_{11} + r_{12}} I_g \tag{2}$$

The input current $I_c$ is injected into the Josephson junction $J_{11}$ through the Josephson junction $J_2$. Thus, the condition for switching the Josephson junction $J_{11}$ is given by $$\frac{r_{12}}{r_{11} + r_{12}} I_g + I_c > I_{11} \tag{3}$$

The line 21 of FIG. 3 corresponds to the above equation (3).

Since the allowable maximum gate current is $(I_{11} + I_{12})$ under the zero-voltage state condition of the Josephson junctions $J_{11}$ and $J_{12}$, the value of the intersection A of the ordinate and the line 21 of FIG. 3 is $(I_{11} + I_{12})$. The condition for switching the Josephson junction $J_2$ is given by $$I_c > I_2 \tag{4}$$

The equation (4) corresponds to the line 23.

Considering the switching order ($J_{11}$, then $J_2$) the gate current must be greater than the value of the intersection B of the lines 21 and 23. The gate current $I_g^{min}$ at the intersection B is expressed as $$I_g^{min} = \frac{r_{11} + r_{12}}{r_{12}} (I_{11} - I_2) \tag{5}$$

Apparently from equation (3), the input sensitivity of the gate is given by $\frac{r_{11} + r_{12}}{r_{12}}$.

If we suppose $r_{11} = r_{12} \equiv r$ and $I_{11} = I_{12} \equiv I_0$ (the fabrication will be facilitated if the same resistance and the same critical current values are adopted), then an appropriate input sensitivity $(r_{11} + r_{12})/r_{12} = 2$ is obtained.

The following condition is required to switch the Josephson junction $J_{12}$ after the completion of switching the Josephson junction $J_{11}$:

$$i_{11} + i_{12} = I_g \tag{6}$$

$$i_{11} \cdot r + i_{21} \cdot r_{21} = i_{12} \cdot r \tag{7}$$

$$I_c + i_{11} = i_{21} + i_0 \tag{8}$$

$$i_0 \cdot r_0 = i_{21} \cdot r_{21} \tag{9}$$

where $i_{11}$, $i_{12}$, $i_{21}$ are currents flowing through the resistors $R_{11}$, $R_{12}$ and $R_{21}$ respectively; $i_0$ is a current flowing through the resistor $R_0$. From these equations we obtain the following equation for the line 24.

$$\frac{(2r_0 \cdot r + r_0 \cdot r_{21} + r \cdot r_{21})I_g + r_0(2r + r_{21})I_c}{2(r_{21} + r_0)r + r_{21} \cdot r_0} > I_0 \quad (10)$$

After the Josephson junction $J_{12}$ has switched, the gate current is injected into the Josephson junction $J_2$. Assuming $r_0 < < r_L$, condition for switching the Josephson junction $J_2$ is given by $$I_g > I_2 \quad (11)$$

The above equation (11) corresponds to the line 22. When the minimum value of $I_g$ given by the equation (11) agrees with $I_g^{min}$ of equation (5), the operation margin becomes maximum.

Consequently, we obtain $$I_2 = \tfrac{2}{3} I_0$$

The values of the intersection points between the line 24 and ordinate and abscissa becomes small as the resistance $r_0$ increases. This is preferable in the light of operating margin, but, considering the backlash of the input current $I_c$, it is desirable to limit $r_0$ to a small value. Thus, the minimum allowable value of $r_0$ is the value attained at the intersection B. Substituting them into equation (8) under the condition $r_{21} = r_{11} \equiv r$ for the easiness of fabrication we obtain $$\frac{3(r_0 + r)\tfrac{2}{3} + 3r_0 \cdot \tfrac{2}{3}}{2(r_0 + r) + r_0} > 1 \quad (12)$$

Hence $r_0 = 4/3 \ r$ is introduced.

More concretely, when the circuit parameters are chosen as follows $$r_{11} = r_{12} = r_{21} = \tfrac{3}{4} \ r_0 = \tfrac{1}{3} \ r_L = 0.5 \ \Omega$$

$$I_{11} = I_{12} = 3/2 \ I_2 = I_3 = 300 \ \mu A,$$

the pulse width calculated by the computer simulation is approximately 30 picoseconds, which is sufficiently short so that the Josephson circuit and the memory circuit can be operated with very high operation speed. The above circuit parameters can easily be achieved by ordinary Josephson integrated circuit fabrication techniques employing lithography with minimum line width of 5 micrometer.

Compared with the pulse generator using a conventional interferometer type gate circuit, the pulse generator according to this invention needs no input line for magnetic coupling with the gate circuit, which in turn makes the fabrication process easy.

Further, the absence of inductances makes it possible to produce a logic gate small in size and suitable for high density integration. It also does not require an additional circuit to damp the resonance because there is no inductance components causing resonance in this circuit. Moreover, since this circuit does not use a superconductive loop, there is no risk of trapping stray magnetic flux and causing erroneous operation.

Figure 4:
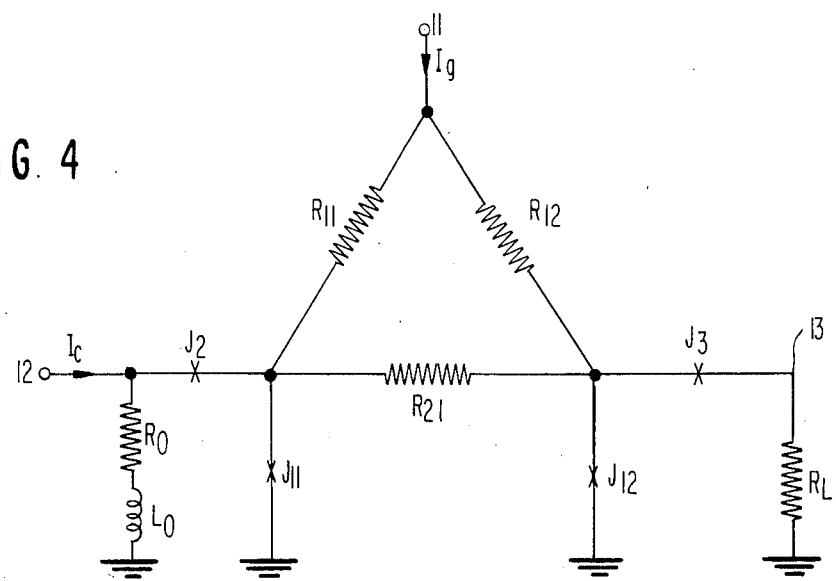
FIG. 4 is an improved circuit of a pulse generator according to another embodiment of the present invention.

Now, another embodiment is explained in the following, based on the construction of FIG. 1 but capable of further reducing the pulse rise time and the pulse fall time. FIG. 4 shows the circuit of this embodiment. The difference from the first embodiment of FIG. 1 is that an inductance component $L_0$ is connected in series with the resistor $R_0$ connected to the input terminal. The operation of this circuit is detailed below.

As the input current $I_c$ is supplied from the input terminal 12, $I_c$ flows through the Josephson junction $J_2$ into the Josephson junction $J_{11}$ to switch the junction $J_{11}$. This causes the current flowing through the Josephson junction $J_{11}$ to inject into the Josephson junction $J_{12}$ through the resistor $R_{21}$ and the resistors $R_{11}$, $R_{12}$, switching the Josephson junction $J_{12}$ into the voltage state. On the other hand, the gate current $I_g$ is bisected into two current paths, a first path made up of the Josephson junction $J_2$, the resistor $R_0$ and the inductance $L_0$ and a second path made up of the Josephson junction $J_3$, the output line 13 and the load resistor $R_L$. If the inductance $L_0$ is set sufficiently large, the current path consisting of the Josephson junction $J_2$, resistor $R_0$ and inductance $L_0$ presents dynamically a large impedance, causing the gate current $I_g$ to flow through the Josephson junction $J_3$ into the output line 13. As a result, the current in the output line 13 rises during the switching time of the Josephson junction $J_{12}$. When the current flowing through the output line 13 exceeds the critical current value of the Josephson junction $J_3$, the Josephson junction $J_3$ is switched into the voltage state interrupting the output current. Therefore, a pulse current is obtained through the output line 13. The gate current $I_g$ flows through the Josephson junction $J_2$, resistor $R_0$ and inductance $L_0$ into ground, switching the Josephson junction $J_2$ into the voltage state. Consequently, the gate current $I_g$ is distributed according to the resistances of the junctions $J_{11}$, $J_{12}$, $J_2$, $J_3$ in the voltage state and flows into ground through them. The input current $I_c$, on the other hand, flows through the resistor $R_0$ and inductance $L_0$ into ground. In this way, the input and output currents are separated.

As explained in the foregoing, the switching order of the Josephson junctions in this circuit is $J_{11}$, $J_{12}$, $J_3$ and $J_2$, and the output pulse $I_{out}$ rises after completion of switching of the Josephson junctions $J_{11}$ and $J_{12}$. Thus an overall capacity of the circuit to be charged at that moment is the sum (=2C) of the capacity (C) of Josephson junctions $J_{11}$ and $J_{12}$. However, in the circuit of FIG. 1 the sequence of switching is $J_{11}$, $J_{12}$, $J_2$ and $J_3$. Therefore, when $I_{out}$ rises, capacitances of the Josephson junctions $J_{11}$, $J_{12}$ and $J_2$ (each capacity is supposed to be C), which amounts to 3C, 1.5 times the capacity of the circuit shown in FIG. 4, have to be charged. Now the rise time and fall time of the output pulse $I_{out}$ depend on the time constant CR. Since the capacitance of the circuit of FIG. 4 when $I_{out}$ is produced is $\tfrac{2}{3}$ the capacitance of the circuit of FIG. 1, as mentioned above, the pulse obtained with the pulse generator of FIG. 4 has a shorter rise time and fall time. In this circuit, too, in order to keep the high input sensitivity and wide operation margin, it is preferable that the design rule similar to that of FIG. 1 be followed. It is apparent that when the connecting sequence of the resistor $R_0$ and inductance $L_0$ is reversed the same effect can be obtained.

Figure 5:
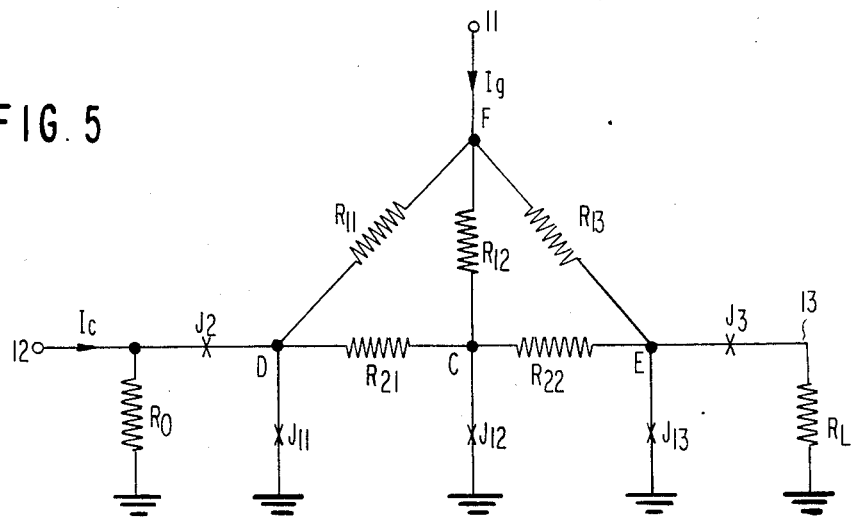
FIGS. 5 and 6 are circuits of pulse generators according to further embodiments of the present invention.

FIG. 5 shows a pulse generator circuit, a still another embodiment of this invention, in which further improvement is made on the operation margin and gain. In this circuit, a resistor $R_{22}$ (resistance $r_{22}$) is inserted between the connecting point C or D (between resistors $R_{12}$ and $R_{21}$ or between resistors $R_{11}$ and $R_{21}$) and the Josephson junction $J_3$ or $J_2$; a resistor $R_{13}$ (resistance $r_{13}$) is inserted between the connecting point E (between the resistor $R_{22}$ and the junction $J_3$) and the connecting point F (between resistors $R_{11}$ and $R_{12}$); and a Josephson junction $J_{13}$ (critical current $I_{13}$) is added between the connecting point E and the ground. The operation margin and the gain are further improved as the number of resistors and Josephson junctions increases. This may be explained as follows.

As is evident from the explanation for FIG. 3, the input sensitivity depends on the gradient of the threshold line 21 for the Josephson junction $J_{11}$. If we suppose the added resistors (n pieces including $R_{11}$ and $R_{12}$) have resistance equal to that of $R_{11}$ and $R_{12}$ and the Josephson junctions (n pieces including $J_{11}$ and $J_{12}$) have critical current equal to $I_{11}$ of $J_{11}$ and $I_{12}$ of $J_{12}$, then the threshold line for the line 21 is expressed as $$\frac{I_g}{n} + I_c = I_{11} \tag{13}$$

Therefore, the greater the number of added resistors and Josephson junctions, the higher the input sensitivity will be.

Since it holds that $I_g > I_2$ and $I_c > I_2$ for lines 22 and 23, respectively, the intersection between lines 21, 22 and 23 is given by $$\frac{I_2}{n} + I_2 = I_{11} \tag{14}$$

That is $$I_2 = \frac{n}{n+1} \cdot I_{11}$$

On the other hand, since $$I_g^{min} = I_2 = \frac{n}{n+1} \cdot I_{11} \tag{15}$$

$$I_g^{max} = n \cdot I_{11} \tag{16}$$

Hence $$\frac{I_g^{max}}{I_g^{min}} = n + 1 \tag{17}$$

Equation (17) also shows that the operating; and margin increases as the number of added resistors and Josephson junctions increases.

The operation of the circuit as shown in FIG. 5 is explained in the following. The gate current $I_g$ is trisected into three current paths, a first path consisting of resistor $R_{11}$ and Josephson junction $J_{11}$, a second path consisting of resistor $R_{12}$ and Josephson junction $J_{12}$, and a third path consisting of resistor $R_{13}$ and Josephson junction $J_{13}$ with $I_{g1}$, $I_{g2}$ and $I_{g3}$, respectively.

As the input current $I_c$ is injected, it flows through the Josephson junctions $J_2$ and $J_{11}$ into ground. As a result, both the gate current $I_{g1}$ and the input current $I_c$ flow through the Josephson junction $J_{11}$, switching it into the voltage state. This causes the current flowing through the Josephson junction $J_{11}$ to inject through the resistor $R_{21}$ and the resistors $R_{11}$, $R_{12}$ into the Josephson junction $J_{12}$, switching the Josephson junction $J_{12}$ to the voltage state. Then the current flowing through the junction $J_{12}$ is injected into the Josephson junction $J_{13}$ through the resistor $R_{22}$ and the resistors $R_{12}$, $R_{13}$, thereby switching the Josephson junction $J_{13}$ into the voltage state.

Consequently, the gate current $I_g$ is bisected into two paths, a first path consisting of Josephson junction $J_2$ and resistor $R_0$ and a second path consisting of Josephson junction $J_3$, output line 13 and load resistor $R_L$. If the resistance $r_L$ of the load resistor $R_L$ is set sufficiently higher than the resistance $r_0$ of the resistor $R_0$, most of the gate current $I_g$ flows through the Josephson junction $J_2$ and resistor $R_0$ thus switching the Josephson junction $J_2$ into the voltage state. This causes the input current $I_c$ to flow through the resistor $R_0$ into ground and the gate current $I_g$ to flow through the Josephson junction $J_3$, output line 13 and load resistor $R_L$ and into the ground. In this way, the input and output are separated.

As the current flowing through the output line 13 exceeds the critical current value $I_3$ of the Josephson junction $J_3$, the Josephson junction $J_3$ is switched into the voltage stage, cutting off the output current. As a result, a pulse current is obtained through the output line 13. The gate current $I_g$ is distributed according to the resistance of each junction in the voltage state and flows into ground through them.

As can be seen from the foregoing, the rise time and fall time of the output pulse current $I_{out}$ are given by the switching time of the Josephson junctions $J_2$ $J_{11}$, $J_{12}$, and $J_{13}$ and $J_3$, respectively. The pulse width is also given as the sum of these switching times.

Figure 6:
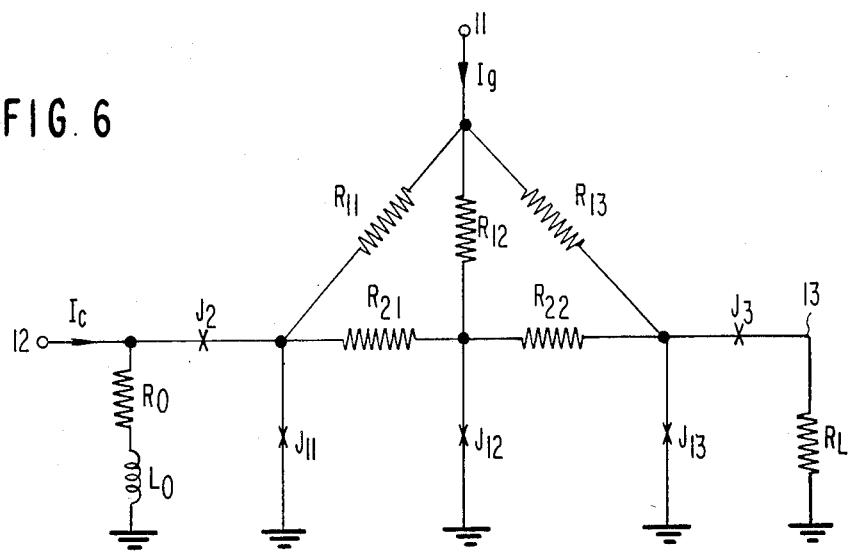

FIG. 6 shows another embodiment of the present invention in which an inductance component $L_0$ is connected in series with the resistance $R_0$ of FIG. 5 to further shorten the output pulse width. The operation of this circuit is similar to that of FIG. 1 and FIG. 4, so a detailed explanation is not presented here. In summary, at the time of switching the Josephson junction $J_3$ from which the output pulse is obtained, the junction $J_2$ is not switched into the voltage state due to the inductance component $L_0$. Therefore the overall capacity of the gate circuit is the sum of each capacity of the Josephson junctions $J_{11}$, $J_{12}$ and $J_{13}$, which is $\frac{3}{4}$ the capacity of the circuit of FIG. 5. This means the pulse width is further reduced.

To ensure correct operation of the pulse generator shown in FIGS. 5 and 6 over wide operation range, it is desirable to follow the design rule, as explained for FIG. 1, such as shown below.

$r_{21} = r_{22} = 0.4\ r_0$ $r_{11} = r_{12} = r_{13}$ $r_L = 10\ r_0$ $I_{11} = I_{12} = I_{13}$ $I_2 = 0.7\ I_{11}$.

What is claimed is:

1. A circuit utilizing Josphson junctions of the type having first and second ends and having an extremely low impedance between said first and second ends in a zero voltage state and a high impedance between said first and second ends in a voltage state and changing from said zero voltage state to said voltage state in response to a current flowing between said first and second ends which is greater than a respective critical current, said circuit comprising a first group of "N"

($N \geq 2$) resistors connected together at one end thereof, each having a predetermined resistance, a second group of "$N-1$" resistors each being connected between the other ends of two of said "$N$" resistors and having a predetermined resistance, said second group of resistors being connected in series between a first node and a second node, a first group of "$N$" Josephson junctions each respective junction being connected between a reference potential and a respective one of said other ends of said first group of resistors and each having a predetermined critical current, a first additional Josephson junction additionally orovided and connected at one end thereof with said first node and having a predetermined critical current, a first resistor connected between said reference potential and the other end of said first additional Josephson junction and having a predetermined resistance, a second additional Josephson junction additionally provided and connected at one end thereof with said second node and having a predetermined critical current, a second resistor connected with the other end of said second additional Josephson junction and having a predetermined resistance, an input terminal connected with the node between said first additional Josephson junction and said first resistor and supplied with an input current having a predetermined amplitude, and a gate terminal connected with said one end of said first group of resistors and supplied with a gate current having a predetermined amplitude, the resistances and critical current values of said resistors and Josephson junctions being selected so that said Josephson junctions are switched into the voltage-state in order that after the Josephson junctions of said first group of Josephson junctions from the Josephson junction of the first group that is connected with said first node to the Josephson junction connected with said second node are switched in response to the injection of a gate current based on said first group of resistors and said input current, said first additional Josephson junction is switched in response to the injection said gate current, and then said second additional Josephson junction is switched in response to the injection of said gate current, said circuit producing an output pulse which rises and falls responsive to the switchings of said Josephson junction of said first group of Josephson junctions connected with said second node and said second additional Josephson junction, respectively, through said second resistor.

2. A circuit as claimed in claim 1, further comprising an inductance component connected in series with said first resistor and having a predetermined value.

3. A circuit as claimed in claim 1, in which "$N$" is 2.

4. A circuit as claimed in claim 1, in which "$N$" is 3.

5. A circuit as claimed in claim 1, in which "$N$" is 2 and said circuit satisfies conditions:

$$r_{11} = r_{12} = r_{21} = \tfrac{3}{2} r_0 = \tfrac{1}{2} r_L$$

$$I_{11} = I_{12} = 3/2 \ I_2 = I_3$$

where $r_{11}$ and $r_{12}$ are the resistances of said first group of resistors counting from said first node side, $r_{21}$ is the resistance of said second group of resistors, $I_{11}$ and $I_{12}$ are the critical current values of said first group of Josephson junctions counting from said first node side, $I_2$ and $I_3$ are the critical currents of said first and second additional Josephson junctions, $r_0$ is the resistance of said first resistor, and $r_L$ is the resistance of said second resistor.

6. A circuit as claimed in claim 1, in which "$N$" is 3 and the circuit satisfies conditions:

$$r_{21} = r_{22} = 0.4 \ r_0$$

$$r_{11} = r_{12} = r_{13}$$

$$r_L = 10 \ r_0$$

$$I_{11} = I_{12} = I_{13}$$

$$I_2 = 0.7 \ I_{11}$$

where $r_{11}$, $r_{12}$, $r_{13}$ and $r_{21}$, $r_{22}$ are the resistance of said first and second groups of resistors, respectively, counting from said first node side, $I_{11}$, $I_{12}$ and $I_{13}$ are the critical currents of said first group of Josephson junctions counting from said first node side, $I_2$ is the critical current of said first additional Josephson junction, $r_0$ is the resistance of said first resistor, and $r_L$ is the resistance of said second resistor.

* * * * *

UNITED STATES PATENT AND TRADEMARK OFFICE
CERTIFICATE OF CORRECTION

PATENT NO. : 4,603,263

DATED : July 29, 1986

INVENTOR(S) : Shuichi TAHARA et al

It is certified that error appears in the above-identified patent and that said Letters Patent is hereby corrected as shown below:

Column 1, Line 19, delete "junctiors", and insert therefor --junctions--.

Column 5, Line 28, after "fabrication", insert --,--.

Column 6, Line 66, delete "qonnecting", and insert therefor --connecting--.

Column 9, Line 12, delete "orovided", and insert therefor --provided--.

Signed and Sealed this

Third Day of February, 1987

Attest:

DONALD J. QUIGG

Attesting Officer

Commissioner of Patents and Trademarks